(12) United States Patent
Kottapalli

(10) Patent No.: US 7,808,294 B1
(45) Date of Patent: Oct. 5, 2010

(54) LEVEL SHIFTER WITH BALANCED RISE AND FALL TIMES

(75) Inventor: Venkata Anil Kottapalli, Fremont, CA (US)

(73) Assignee: Netlogic Microsystems, Inc., Santa Clara, CA (US)

( * ) Notice: Subject to any disclaimer, the term of this patent is extended or adjusted under 35 U.S.C. 154(b) by 50 days.

(21) Appl. No.: 11/974,714

(22) Filed: Oct. 15, 2007

(51) Int. Cl.
*H03L 5/00* (2006.01)

(52) U.S. Cl. ............................ 327/333; 326/68; 326/81

(58) Field of Classification Search ................. 327/333; 326/68, 80, 81; 365/189.11
See application file for complete search history.

(56) References Cited

U.S. PATENT DOCUMENTS

| | | | |
|---|---|---|---|
| 5,742,183 A | 4/1998 | Kuroda | 326/81 |
| 5,942,921 A | 8/1999 | Talaga, Jr. | 327/77 |
| 6,002,290 A * | 12/1999 | Avery et al. | 327/333 |
| 6,067,257 A | 5/2000 | Kitsukawa et al. | 365/189.11 |
| 6,518,790 B2 | 2/2003 | Wada et al. | 326/81 |
| 6,774,695 B2 * | 8/2004 | Hayashi et al. | 327/333 |
| 6,933,755 B2 * | 8/2005 | Hong et al. | 327/333 |
| 6,954,099 B2 * | 10/2005 | Brox | 327/333 |
| 2003/0222678 A1 | 12/2003 | Sun | 326/68 |

* cited by examiner

*Primary Examiner*—Long Nguyen
(74) *Attorney, Agent, or Firm*—Haverstock & Owens, LLP

(57) ABSTRACT

A level shifting circuit can include a shift stage that latches first and second internal nodes to opposite shifted logic potentials in response to different transitions at an input signal node. The input signal node can vary between non-shifted logic potentials. An output stage can enable a first controllable impedance path coupled between an output node and a first shifted power supply node in response to a first type transition at the first internal node, and can enable a second controllable impedance path coupled between the output node and a second shifted power supply node in response to the first type transition at the second internal node.

18 Claims, 9 Drawing Sheets

US 7,808,294 B1

LEVEL SHIFTER WITH BALANCED RISE AND FALL TIMES

TECHNICAL FIELD

The present invention relates generally to level shifting circuits, and more particularly to level shifting circuits that can produce shifted signal levels with balanced rise and fall delays.

BACKGROUND OF THE INVENTION

Level shifting circuits can shift an input signal, that transitions between a first voltage range, into an output signal that transitions between a second voltage range, that can be greater or smaller than the first voltage range. Level shifting operations are typically utilized to allow one signal, generated in one voltage domain (i.e., range), to drive circuits operating in another voltage domain. For applications in which level shifters are included in timing signal paths, ensuring predictable signal delays can present design challenges.

To better understand various features of the disclosed embodiments, a conventional level shifting circuit will now be described.

Referring now to FIG. 9, a conventional level shifting circuit is shown in a schematic diagram and designated by the general reference character 900. A level shifting circuit 900 can include a low voltage input section 902, a level shifting stage 904, and a high voltage output stage 906. In response to a low-to-high transition (VSS to VDD_LO) of an input signal IN received by low voltage input section 902, conventional level shifting circuit 900 can generate an output signal OUT that transitions from low-to-high (VSS to VDD_HI). Conversely, in response to a high-to-low transition (VDD_LO to VSS) of input signal IN, conventional level shifting circuit 900 can generate an output signal OUT that transitions from high-to-low (VDD_HI to VSS).

However, in the conventional level shifting circuit shown, different types of input transitions have different circuit delay components. In particular, a conventional low-to-high response can be described as introducing a rise delay (Delay_HI) expressed as follows:

$$Delay\_HI = tf1 + tr2 + tfa + trd + tf6 + tr7$$

where tf1 is a fall delay introduced by inverter 1, tr2 is a rise time introduced by inverter 2, tfa is the delay introduced by n-channel transistor "a" driving the gate of p-channel transistor "d" low enough to turn on transistor "d", trd is the delay introduced by transistor "d" driving the input of inverter 6 high, tf6 is a fall delay introduced by inverter 6, and tr7 is a rise time introduced by inverter 7.

In a similar fashion, a high-to-low response can be described as introducing a fall delay (Delay_LO) expressed as follows:

$$Delay\_LO = tr3 + tf4 + tr5 + tfb + tr6 + tf7$$

where tr3 is a rise delay introduced by inverter 3, tf4 is a fall delay introduced by inverter 4, tr5 is a rise time introduced by inverter 5, tfb is the delay introduced by n-channel transistor "b" driving the input of inverter 6 low, tr6 is a rise delay introduced by inverter 6, and tf7 is a fall time introduced by inverter 7.

While a conventional approach can attempt to tune the above delays (for example, by sizing transistors) to try to create equal values for Delay_HI and Delay_LO, such a balance is very difficult to achieve over wide range of operating conditions and/or process variations.

A reference to the above expressions shows that value Delay_HI includes components tfa (introduced by n-channel device a) and trd (introduced by p-channel device d). In contrast, the value Delay_LO only includes component tfb (introduced by n-channel device b). These delay components of the level shifting stage 904 can vary as power supply voltage levels vary. Further, changes in fall components (e.g., tfa and tfb) of level shifting stage 904 due to different power supply voltage levels do not track corresponding changes in rise components (e.g., trd). Further, these delays can further vary due to manufacturing process variations and/or operating temperature.

All of the above make it difficult to achieve balanced delay times (rise and fall) utilizing conventional techniques.

DETAILED DESCRIPTION

Various embodiments of the present invention will now be described in detail with reference to a number of drawings. The embodiments include level shifting circuits that can produce shifted signal levels with balanced rise and fall delays, and signal balancing methods for level shifting circuits.

Figure 1:
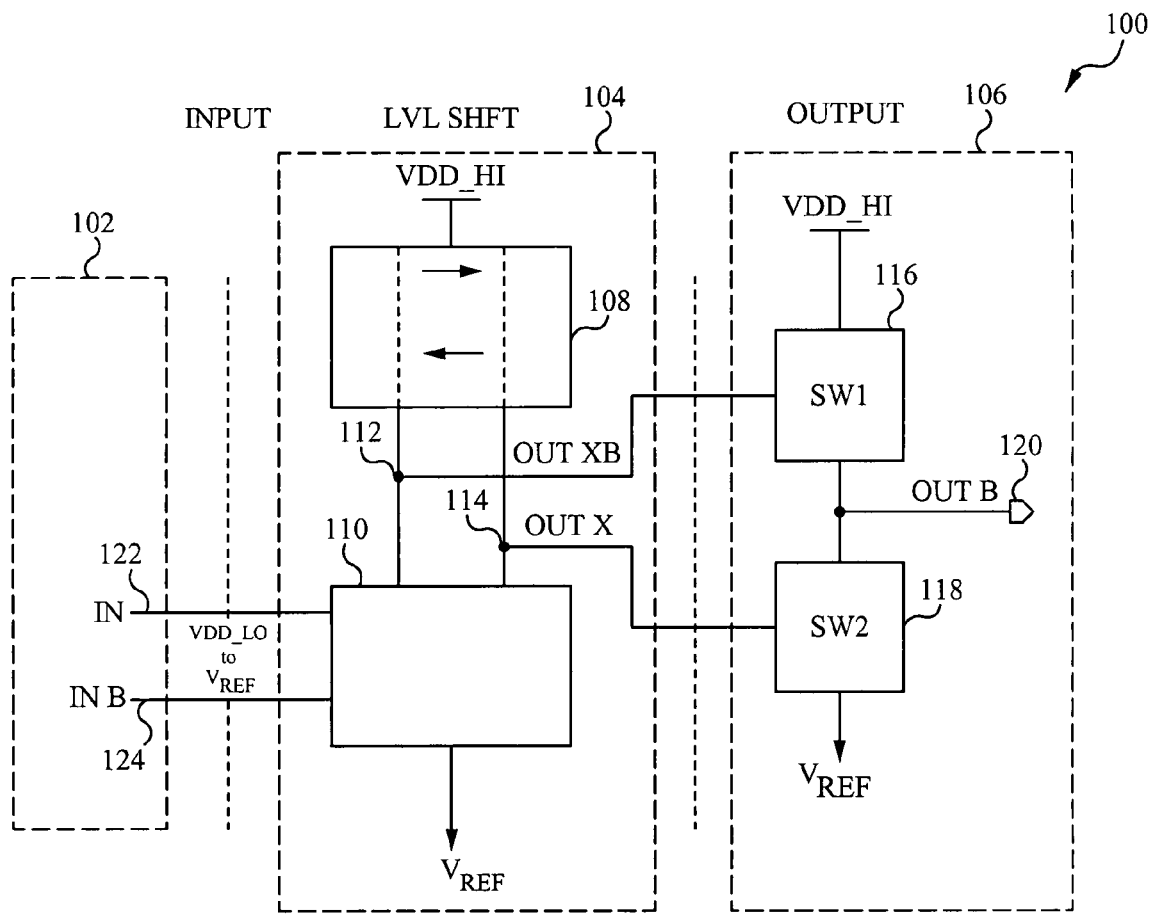
FIG. 1 is a block schematic diagram of a level shifting device according to a first embodiment of the invention.

Referring now to FIG. 1, a level shifting circuit according to a first embodiment is shown in a block schematic diagram and designated by the general reference character 100. A level shifting circuit 100 can include an input stage 102, a shift stage 104, and an output stage 106. Input stage 102 can include input paths 122, 124. Input paths 122, 124 can carry signals that vary within a first voltage range, which in this particular example is shown to be between a non-shifted high power supply voltage VDD_LO and a reference voltage VREF.

Shift stage 104 can include a high voltage section 108, low voltage section 110, a first internal node 112 and a second internal node 114. Shift stage 104 can operate between shifted power supply voltages, which in the example shown include a shifted high power supply voltage VDD_HI, which can be greater than VDD_LO and reference voltage $V_{REF}$. A low voltage section 110 can receive non-shifted input signals on input paths 122 and 124, and in response to such signals, can drive first internal node 112 or second internal node 114 to or toward the shifted reference level (in this case $V_{REF}$).

High voltage section 108 can be connected to low voltage section 110 via first internal node 112 and second internal node 114. High voltage section 108 can latch first and second internal nodes (112 and 114) at different voltages. As but one example, a high voltage section 108 can include inherent feedback between first and second internal nodes (112 and 114) that helps maintain such nodes in a particular state, and must be overcome in order to switch node states. First internal node 112 can provide a signal OUT XB and second internal node 114 can provide a signal OUT X, both of which can be output to output stage 106.

Output stage 106 can include a pull-up switch 116, a pull-down switch 118 and an output node 120. Output stage 106 can operate between shifted power supply voltages, which in this particular example, can be the same as those of shift stage 104 (VDD_HI and $V_{REF}$). Pull-up switch 116 can have a switch path connected between a shifted high voltage supply VDD_HI and output node 120, and can be controlled according to signal OUT XB generated at first internal node 112. In a similar fashion, pull-down switch 118 can have a switch path connected between output node 120 and reference voltage VREF, and can be controlled according to signal OUT X generated at second internal node 114.

Various examples of possible operations for the embodiment shown in FIG. 1 will now be described with reference to FIG. 1A.

Figure 1A:
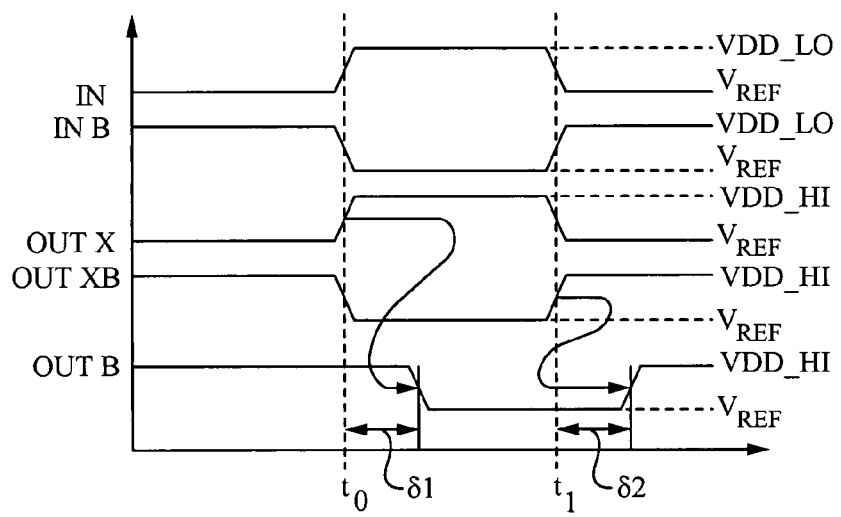
FIG. 1A is a timing diagram showing operations of the level shifting device shown in FIG. 1.

Referring now to FIG. 1A, a timing diagram shows an example of a balanced level shifting operation for a level shifting circuit 100 like that of FIG. 1. FIG. 1A shows a number of waveforms, including waveforms IN, INB, which can indicate low voltage input signals that are complementary to each other. Waveforms OUTX, OUTXB can indicate high voltage intermediate signals that are complementary to each other. Waveform OUTB can indicate an output signal generated at output node 120.

Prior to time t0, a first input signal IN and a second input signal INB can be in a predetermined settled state. High voltage section 108 can latch first and second internal nodes (112 and 114) in predetermined states, which results in signal OUT X being inactive (low, in this example) and signal OUT XB being active (high, in this example). With signal OUT X being inactive, pull-down switch 118 can be in a high impedance state. With signal OUT XB being active, pull-up switch 116 can be in a low impedance state, thus output signal OUTB can be at a high voltage for output stage, which in this case can be VDD_HI.

At about time t0, first input signal IN can transition to a level VDD_LO and complementary second input signal INB can transition to a level VREF. In response to such transitions of the input signals (IN and INB), low voltage section 110 can drive OUT XB toward VREF. This, in turn, can result in high voltage section 108 driving second internal node 114 to a shifted high voltage at VDD_HI. Resulting intermediate signals OUTXB, OUTX can be applied within output stage 106. First intermediate signal OUT XB can cause pull-up switch 116 to enter a high impedance state. Second intermediate signal OUT X can have a rising potential that can cause pull-down switch 118 to change from a high impedance state to a low impedance state. As a result, output signal OUT can transition to a low supply level (in this case VREF) after about a delay ∂1 following time t0.

At about time t1, first input signal IN can transition to a level VREF and second input signal INB can transition to a level VDD_LO. Low voltage section 110 can drive OUT X toward $V_{REF}$. Consequently, high voltage section 108 can latch this new state which can cause a shifted high voltage VDD_HI at first internal node 112. These new levels for intermediate signals OUTXB, OUTX can be provided to output stage 106. In particular, first intermediate signal OUT XB can cause pull-up switch 116 to change from a high impedance state to a low impedance state. Second intermediate signal OUTX can cause pull-down switch 118 to switch to a high impedance state. As a result, output signal OUTB can transition to a high supply level (in this case VDD_HI) after about a delay ∂2 following time t1.

In this way, a level shifting circuit can shift a voltage level of input signals. In response to a shifting operation, an output of an output node 120 can generate an output signal having transitions of essentially equal delay compared to input transitions of one or more input signals.

Figure 2:
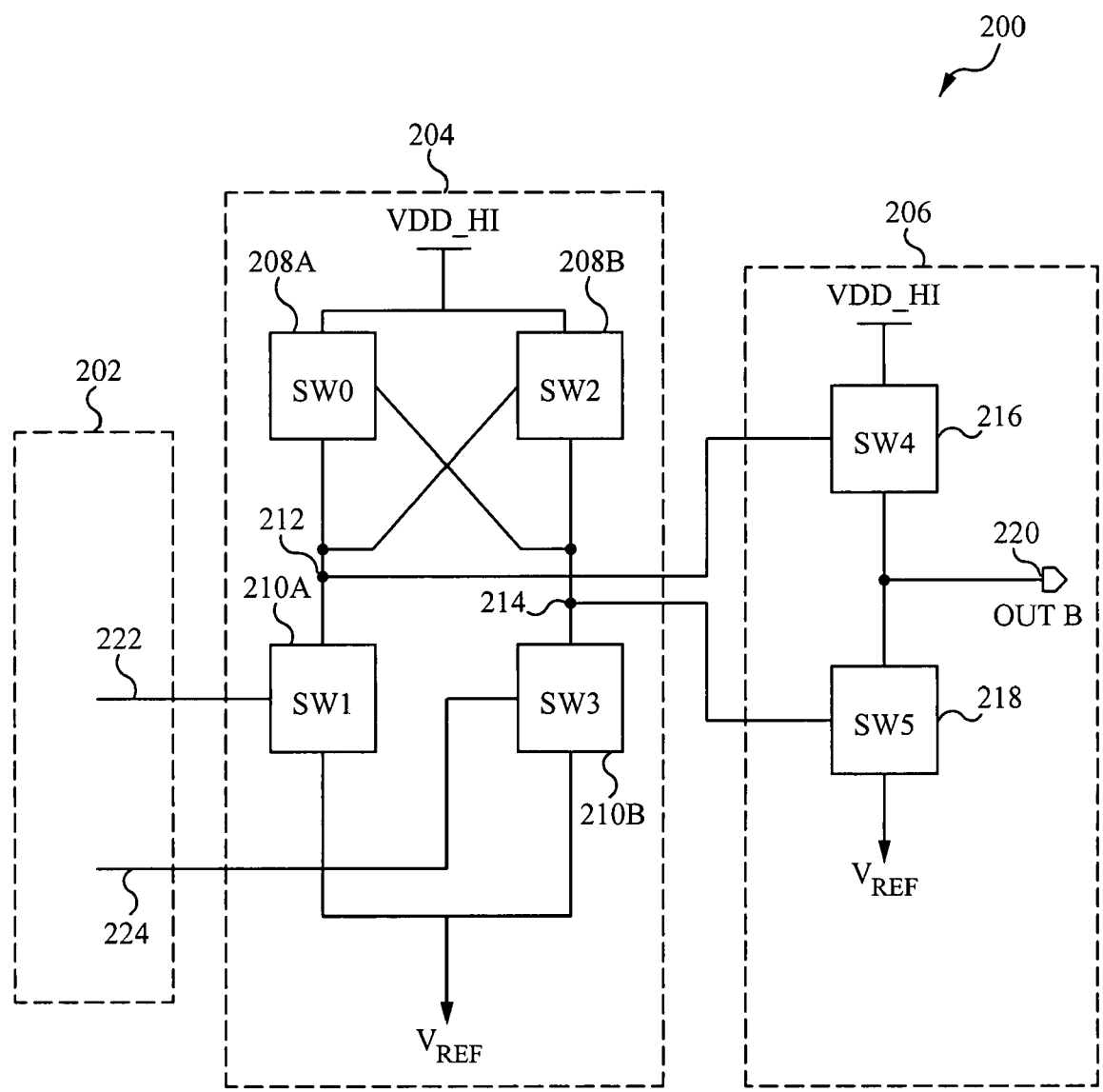
FIG. 2 is a block schematic diagram of a level shifting device according to another embodiment of the invention.

Referring now to FIG. 2, a level shifting circuit according to another embodiment is shown in a block schematic diagram and designated by the general reference character 200. A level shifting circuit 200 can include an input stage 202, a shift stage 204, and an output stage 206. Input stage 202 can include input paths 222, 224 connected to shift stage 204. Input paths 222, 224 can carry signals that vary within a first voltage range, which in this particular example can be a high logic level that is less than the high supply voltage for shift stage 204 and output stage 206 (which in this case would be a voltage less than VDD_HI). Input paths 222, 224 can carry signals that are complementary to one another.

Shift stage 204 can include a first shifting switch 208A, a second shifting switch 208B, a first input switch 210A, a second input switch 210B, a first internal node 212 and a second internal node 214. First input path 222 can be connected to and can control the operation of a first input switch 210A of shift stage 204. Similarly, second input path 224 can be connected to and can control a second input switch 210B.

A first shifting switch 208A can be connected to first input switch 210A via first internal node 212 and to a shifted high voltage VDD_HI, and can be controlled according to the potential at second internal node 214. A second shifting switch 208B can be connected between a second input switch 210B and a shifted high voltage VDD_HI, and can be connected to the potential at first internal node 212. First input switch 210A can be connected between a low voltage VREF and a first internal node 212. Second input switch 210B can be connected between a low voltage VREF and a second internal node 214. First input switch 210A can be controlled according to a signal on first signal path 222 and second input switch 210B can be controlled according to signal on second signal path 224. First internal node 212 and second internal node 214 can be connected to the output stage 206.

Figure 9:
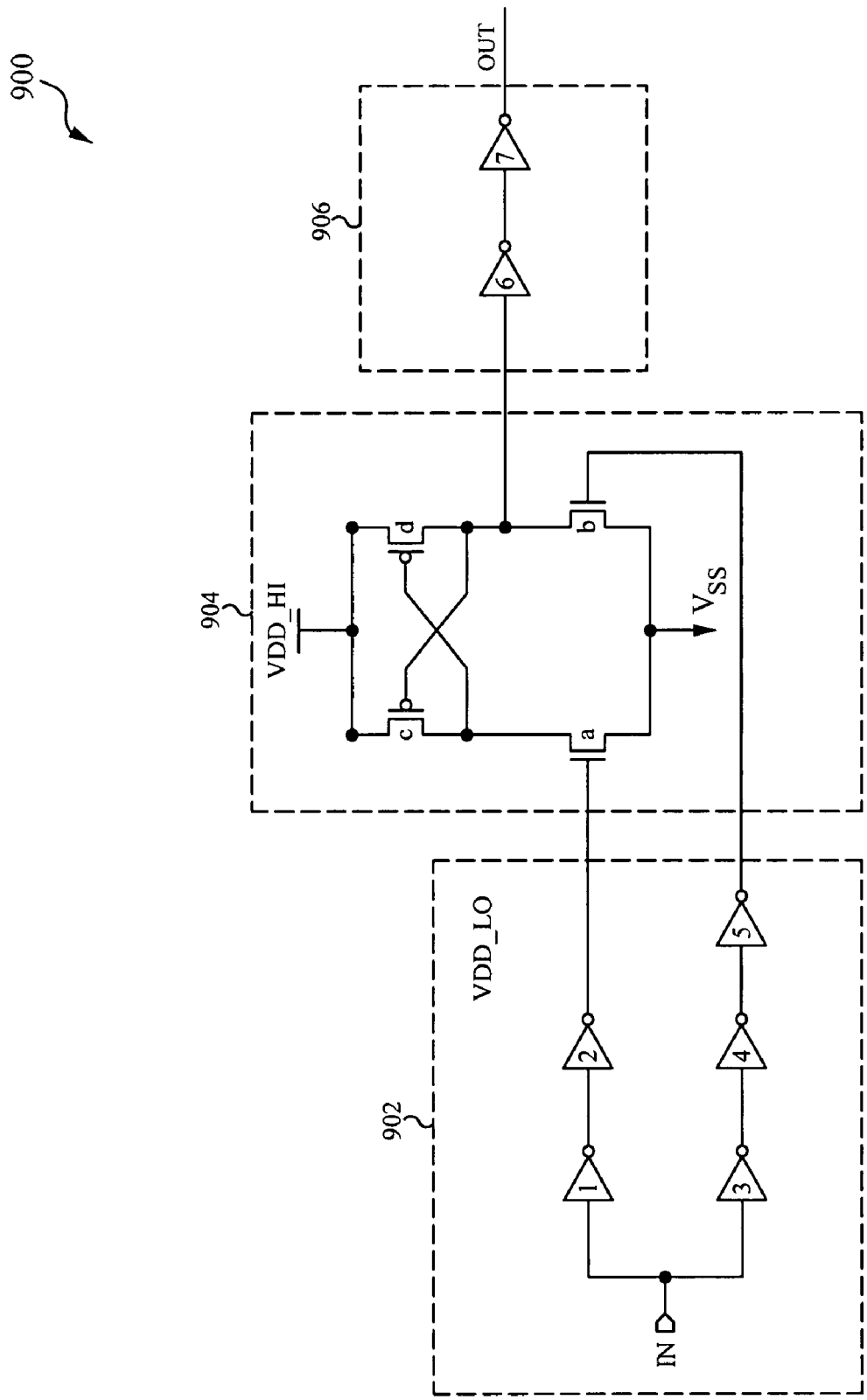
FIG. 9 is a schematic diagram showing a conventional level shifting circuit.

The shift stage 204 can be conceptualized as having a positive feedback effect built into the responses at first and second internal nodes (212 and 214). That is, when a potential at a one internal node (e.g., 212 or 214) is at an active potential (e.g., VREF), a corresponding shifting switch (e.g., 208B or 208A) can drive the other internal node (214 or 212) to an inactive potential (e.g., VDD_HI). This in turn, keeps the other shifting switch (208A or 208B) disabled. This positive feedback must be overcome to cause shift stage 204 to latch opposite states at internal nodes (212 and 214), and can therefore introduce a delay. The embodiment of FIG. 2 can ensure that this delay is introduced into a resulting output signal OUTB, regardless of which input signal path (222 or 224) is active. In particular, output signal OUTB is driven to one level (e.g., VDD_HI) in response to one type of transition (e.g., low-to-high) at first internal node 212, and is driven to the other level (e.g., VREF) in response to the same type transition (low-to-high) at the second internal node 214. This is in contrast to a conventional arrangement like that of FIG. 9, which generates both types of output transitions in response to different type transitions at the same internal node.

Output stage 206 can include a pull-up switch 216, a pull-down switch 218 and an output node 220. Pull-up switch 216 can be connected to a shifted high voltage VDD_HI and to pull-down switch 218 through output node 220, and can be controlled according to the potential at first internal node 212. Pull-down switch 218 can be connected between a low voltage VREF and output node 220. Pull-down switch 218 can also be controlled according to the potential at second internal node 214.

Figure 3A:
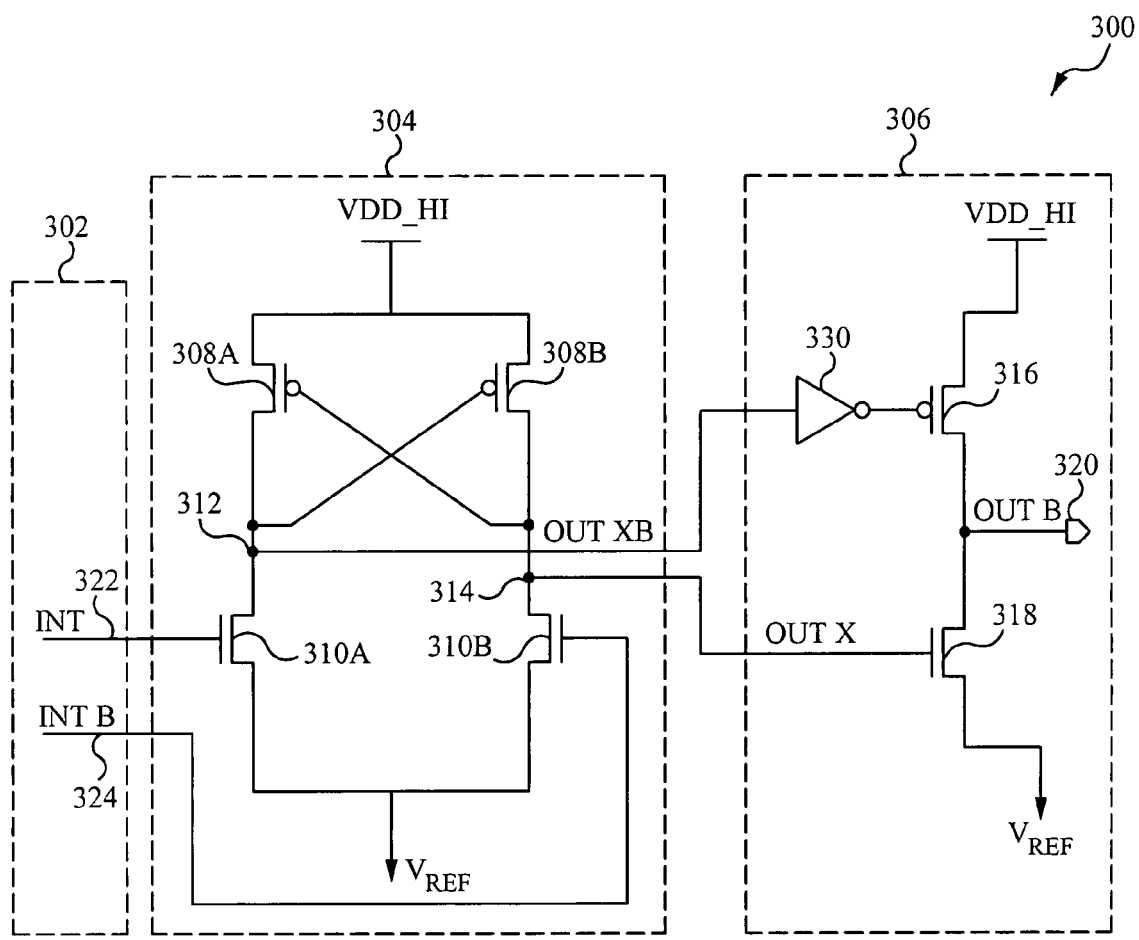
FIG. 3A is a schematic diagram of a level shifting device according to yet another embodiment of the invention.

Referring now to FIG. 3A, a level shifting circuit according to yet another embodiment is shown in a schematic diagram and designated by the general reference character 300. A level shifting circuit 300 can include an input stage 302, a shift stage 304, and an output stage 306. Input stage 302 can include input paths 322, 324 connected to shift stage 304.

Shift stage 304 can include a first shifting transistor 308A, a second shifting transistor 308B, a first input transistor 310A, a second input transistor 310B, a first internal node 312 and a second internal node 314. In the particular example of FIG. 3A, first and second input transistors (310A and 310B) can be n-channel insulated gate (e.g., metal-oxide-semiconductor) field effect transistors (FETs), and first and second shifting transistors (308A and 308B) can be p-channel FETs. A first shifting transistor 308A can have a drain connected to first internal node 312, a source connected to a shifted high voltage VDD_HI, and a gate connected to second internal node 314. A second shifting transistor 308B can have a source connected to a shifted high voltage VDD_HI, a drain connected to second internal node 314, and a gate connected to a first internal node 312. First input transistor 310A can have a source connected to a reference voltage VREF and a drain connected to a first internal node 312. Second input transistor 310B can have a source connected to a reference voltage VREF and a drain connected to a second internal node 314. First input transistor 310A can be connected to first signal path 322 via a control terminal of the first input transistor 310A and second input transistor 310B can be connected to second signal path 324 via a control terminal of the second input transistor 310B. First internal node 312 and second internal node 314 can be connected to the output stage 306.

Output stage 306 can include a pull-up transistor 316, a pull-down transistor 318 and an output node 320. In the particular example shown, pull-up transistor 316 can be a p-channel FET and pull-down transistor 318 can be an n-channel FET. Pull-up transistor 316 can have a source connected to a shifted high voltage VDD_HI, a drain connected to output node 320, and a gate connected to first internal node 312 by way of inverter 330. Pull-down transistor 318 can have a source connected to a low voltage (VREF), a drain connected to output node 320, and a gate connected to second internal node 314.

Various examples of possible operations for the embodiment shown in FIG. 3A will now be described with reference to FIG. 3B.

Figure 3B:
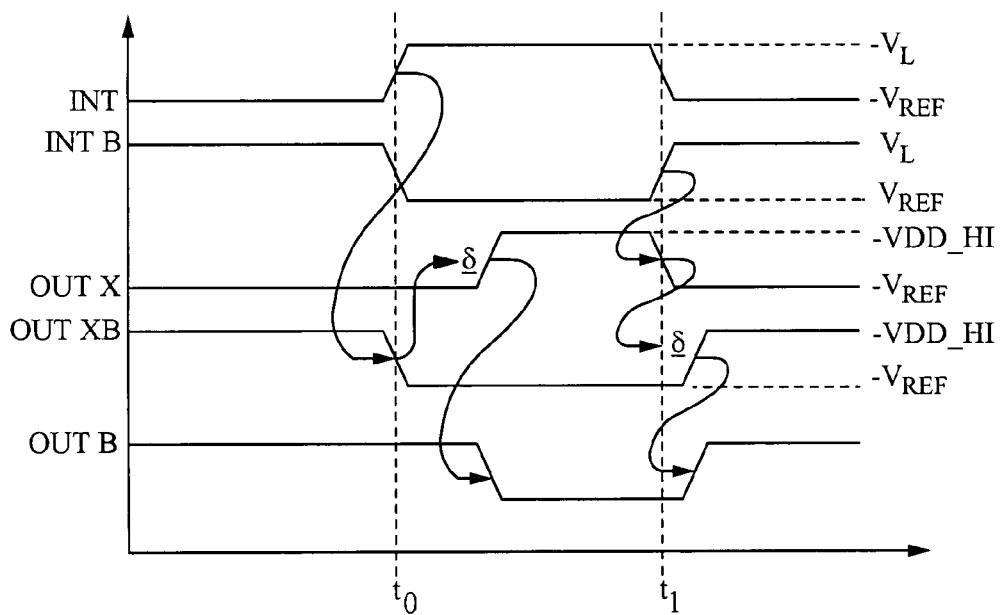
FIG. 3B is a timing diagram showing an operation of the level shifting device shown in FIG. 3A.

Referring now to FIG. 3B, a timing diagram shows an example of a balanced level shifting operation for a level shifting circuit 300 like that of FIG. 3A. FIG. 3B shows a number of waveforms, including waveforms INT, INTB, which can indicate low voltage input signals that are complementary to each other. Waveforms OUTX, OUTXB can indicate high voltage intermediate signals that are complementary to each other and can occur at internal nodes 314 and 312, respectively. Waveform OUTB can indicate an output signal having a potential that is generated at output node 320.

Prior to time t0, a first input signal INT is low (e.g., at VREF) and a second input signal INTB is high (e.g., at VL, where VL<VDD_HI). A first input transistor 310A can be turned off, isolating internal node 312 from a low voltage VREF, while second input transistor 310B can be turned on, keeping internal node 314 at VREF. With internal node 314 at VREF, first shifting transistor 308A can be turned on, keeping internal node 312 at VDD_HI. With internal node 312 at VDD_HI, second shifting transistor 308B can be in a high impedance state, isolating internal node 314 from VDD_HI. Within output section 306, signal OUT XB from internal node 312 can be inverted by inverter 330 to a low level, and applied pull-up transistor 316, maintaining the transistor in a low impedance state, and thus connecting output node 320 to a level VDD_HI. Signal OUT X can be applied to pull-down transistor 318, placing it into a high impedance state.

At about time t0, first input signal INT can transition to an asserted level VDD_HI and complementary second input signal INTB can transition to a non-asserted level VREF. Asserted first input signal INT can bias on first input transistor 310A while non-asserted input signal INTB can bias off second input transistor 310B. As a result, second shifting transistor 308B can change to a low impedance state, which can cause high voltage signal VDD_HI to be received at second internal node 314. This, in turn, can change first shifting transistor 308A to a high impedance state, which can cause low voltage signal VREF to be received at first internal node 312. Intermediate signals OUTXB, OUTX can be received within the output stage 306. A first intermediate signal OUTXB can be received at pull-up transistor 316 via inverter 330 and a second intermediate signal OUTX can be received at pull-down transistor 318. First intermediate signal OUTXB can have a falling potential that can cause pull-up transistor 316 to switch to a high impedance state. Second intermediate signal OUTX can have a rising potential that can cause pull-down transistor 318 to change from a high impedance state to a low impedance state. As a result; output signal OUTB can have a falling potential in response to a rising potential of second intermediate signal OUTX.

At about time t1, first input signal INT can transition to a non-asserted level VREF and complementary second input signal INTB can transition to an asserted level VL. Asserted second input signal INB can bias on second input transistor 3106 while non-asserted first input signal IN can bias off first input transistor 310A. As a result, first shifting transistor 308A can change to a low impedance state, which can cause high voltage signal VDD_HI to be received at first internal node 312. This can cause low voltage VREF to be received at second internal node 314. Intermediate signals OUTXB, OUTX can be received within the output stage 306. A first intermediate signal OUTXB can be received at pull-up transistor 316 via inverter 330 and a second intermediate signal OUTX can be received at pull-down transistor 318. First intermediate signal OUTXB can have a rising potential that can cause pull-up transistor 316 to change from a high impedance state to a low impedance state. Second intermediate signal OUTX can have a falling potential that can cause pull-down transistor 318 to remain in a high impedance state.

As a result, output signal OUTB can have a rising potential in response to a rising potential of first intermediate signal OUTXB.

The response described above can result in different types of input transitions having essentially the same circuit delay components within shift stage 304. In particular, a low-to-high response for input signal INT (and high-to-low response for input signal INTB) can be described as introducing a rise delay (Delay_HI) expressed as follows:

$$Delay\_HI = tf(310A) + tr(308B)$$

where tf(310A) is the delay introduced by n-channel transistor driving the gate of p-channel transistor 308B low enough to turn the transistor on and tr(308B) is the delay introduced by transistor 308B driving the input of inverter 330 high.

In a similar fashion, a low-to-high response of signal INTB (and high-to-low response of signal INT) can be described as introducing a fall delay (Delay_LO) expressed as follows:

$$Delay\_LO = tf(310B) + tr(308A)$$

where tf(310B) is the delay introduced by n-channel transistor driving the gate of p-channel transistor 308A low enough to turn the transistor on and tr(308A) is the delay introduced by transistor 308A driving the gate of pull-down transistor 318 low.

In this way, a level shifting circuit can shift a voltage level of input signals. In response to a shifting operation, an output signal can be generated having transitions of equal delay compared to input transitions of a first and a second input signal.

Figure 4:
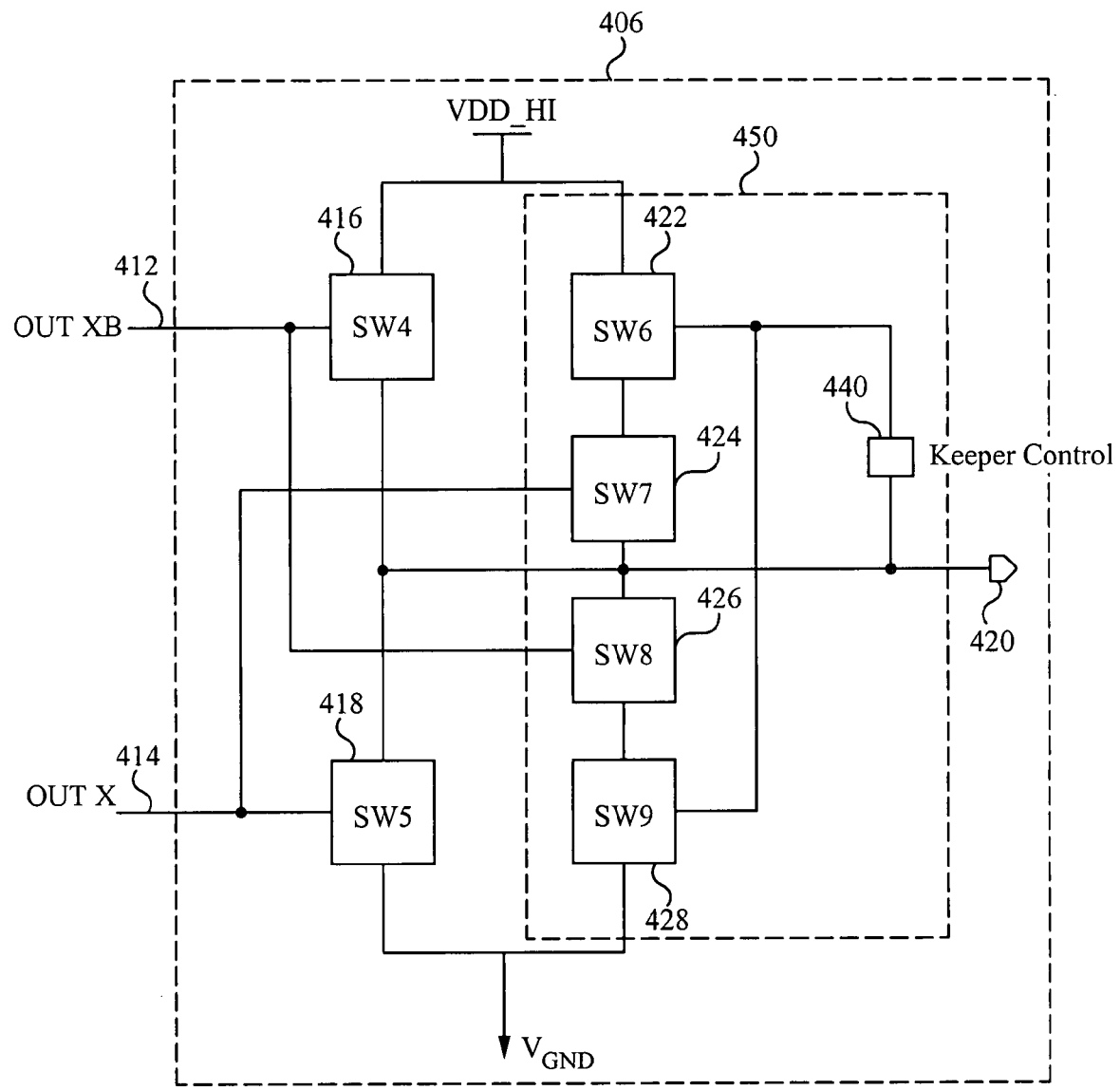
FIG. 4 is a block schematic diagram of an output stage of a level shifting circuit that can be included in embodiments of the invention.

Referring now to FIG. 4, an output stage that can be included in level shifting circuits is shown in a block schematic diagram and designated by the general reference character 406.

Output stage 406 can include a pull-up switch 416, a pull-down switch 418, an output node 420 and a keeper circuit 450. Pull-up and pull-down switches (416 and 418) in the same general fashion as switches 116 and 118 shown in FIG. 1, providing low or high impedance paths to a high voltage (in this case VDD_HI) or a low voltage (in this case $V_{GND}$) according to transitions in signals OUT XB and OUT X. A keeper circuit 450 can maintain output node 420 at a predetermined shifted logic potential in the event one of the internal nodes 412, 414 makes a second type transition prior to other internal node making a first type transition.

Pull-up switch 416 can be connected between a high voltage VDD_HI and output node 420. Pull-up switch 416 can also be controlled according to a signal at first internal node 412. Pull-down switch 418 can be connected between a low voltage (e.g., ground potential VGND) and output node 420. Pull-down switch 418 can also be controlled according to a signal at second internal node 414.

A keeper circuit 450 can include a first break switch 426, a first keeper switch 428, a second break switch 424, second keeper switch 422, and keeper logic 440. A first break switch 426 can be connected between a first keeper switch 428 and output node 420, and can be controlled according to signal OUT XB. A second break switch 424 can be connected between second keeper switch 422 and output node 420 and can be controlled according to signal OUT X. First keeper switch 428 can be connected to low voltage (VGND) and connected to first break switch 426, and can be controlled according to an output from keeper logic 440. Second keeper switch 422 can be connected between a high voltage VDD_HI and second break switch 424, and can be controlled according to an output from keeper logic 440. Keeper control logic 440 can be connected between an output node 420 and first keeper switch 428, and second keeper switch 422.

Referring still to FIG. 4, an output stage 406 can be conceptualized as having a "set" state, a "kept" state, and a transitional operation.

It is initially noted that signals OUT X and OUT XB can have asserted and non-asserted levels. Further, such signals can have a predetermined timing relationship to one another when switching levels. In particular, both signals will be at non-asserted levels prior to one of the signals switching to the asserted level. As but one very particular example, if reference is made back to FIG. 3B, after time t0, signals OUT X and OUT XB are both at non-asserted levels (in this case $V_{REF}$) prior to signal OUT X being driven to the asserted level (in this case VDD_HI). Also, after time t1, signals OUT X and OUT XB are both once again at non-asserted levels (in this case $V_{REF}$) prior to signal OUT XB being driven to the asserted level.

In a set state, one of signals OUT X or OUT XB is at an asserted level while the other is at a non-asserted level. As but one very particular example, for a signal OUT X an asserted level can be VDD_HI and a non-asserted level can be VGND, while an asserted level for signal OUT XB can be VDD_HI and a non-asserted level can be VGND. In a set state, output node 420 can be connected to either a shifted high voltage VDD_HI or low voltage VGND by keeper circuit 450 and either the pull-up or pull-down switch (416 or 418). That is, in one of the set states switches 416, 422 and 424 can have low impedances, while switches 418, 426 and 428 can have high impedances. Conversely, in the other of the set states, switches 416, 422 and 424 can have high impedances, while switches 418, 426 and 428 can have low impedances.

In a kept state, one of signals OUT X or OUT XB switches to a non-asserted level while the other signal remains at the non-asserted level. In such a state, keeper circuit 450 can maintain a previously established output state, despite the fact that both signals OUT X and OUT XB are at non-asserted levels. For example, if signal OUT XB remains non-asserted as signal OUT X switches from an asserted level to a non-asserted level, even though switch 418 is placed into a high impedance state, switches 426 and 428 can keep output node 420 at $V_{GND}$. Similarly, if signal OUT X remains non-asserted as signal OUT XB switches from an asserted level to a non-asserted level, even though switch 416 is placed into a high impedance state, switches 422 and 424 can keep output node 420 at the VDD_HI level.

In a transitional operation, one of signals OUT X or OUT XB, previously in a non-asserted state can transition to an asserted state. During such a transitional operation, break switches (424 and 426) can help ensure a pull-down or pull-up switch (416 or 418) does not have to fight its opposing keeper switch (428 or 422). In particular, if signal OUT XB transitions to an asserted level while first keeper switch 428 is in a low impedance state, first break switch 426 will be placed into a high impedance state, preventing "crowbar" current from flowing through switches 416 and 428. Conversely, if signal OUT X transitions to an asserted level while second keeper switch 422 is in a low impedance state, second break switch 424 will be placed into a high impedance state, preventing crowbar current from flowing through switches 414 and 422.

In this way, an output stage can prevent undesirably large draws of current when an output switches between states.

Is it noted that in an alternate embodiment, output stage can have the same general configuration as that shown in FIG. 4, but not include break switches 424 and/or 426. In such an arrangement, the corresponding pull-down or pull-up switch (416 or 418) would be suitably large enough to "overpower" the corresponding keeper switch (428 or 422).

Figure 5:
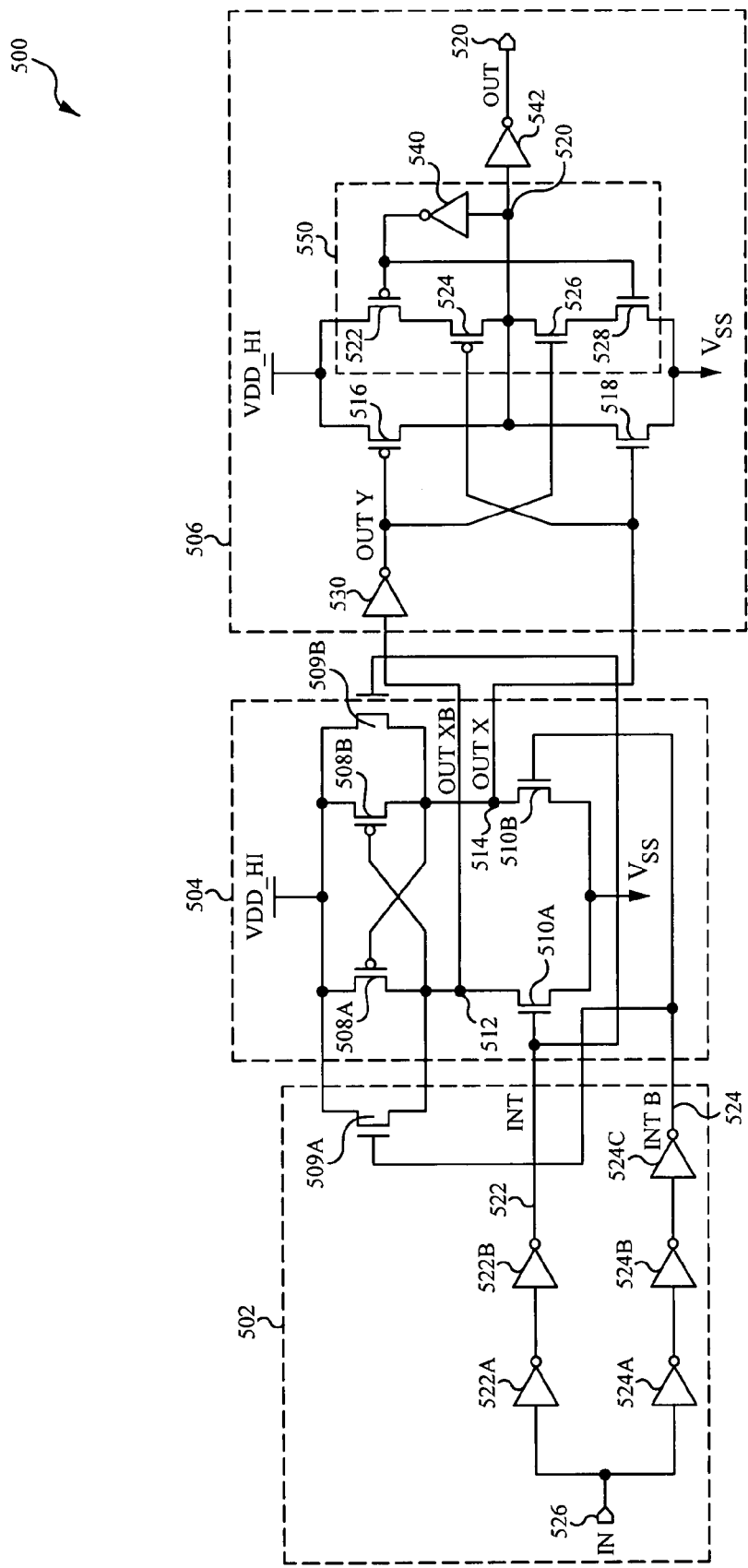
FIG. 5 shows a schematic diagram of a level shifting device according to an alternative embodiment of the invention.

Referring now to FIG. 5, a level shifting circuit according to another alternative embodiment is shown in a schematic diagram and designated by the general reference character 500. Level shifting circuit 500 can include an input stage 502, a shift stage 504, and an output stage 506. An input stage 502 can receive one input signal (IN) that transitions between two logic levels and can generate two signals (INT and INT B) representing different transitions of the one input signal (IN). In the particular case of FIG. 5, signal INT can essentially follow signal IN. That is, signal INT can transition low-to-high in response to input signal (IN) transitioning low-to-high. In contrast, signal INT B can transition from low-to-high in response to signal IN transitioning from high-to-low. An input stage 502 can operate in a low voltage domain, thus signals IN, INT and INT B can transition between non-shifted logic levels, which in this particular example, can be between VDD_LO and VSS. While an input stage can be implemented with various logic circuits, in the very particular example shown, input stage 502 can include an input node 526 connected to input paths 522, 524 via a first set of inverters 522A, 522B and via a second set of inverters 524A, 524B, 524C. First input path 522 and second input path 524 can be connected to shift stage 504.

Shift stage 504 can have the same general structure as that shown as 304 in FIG. 3A, thus like items are referred to by the same reference character, but with the first digit being a "5" instead of a "3".

The shift stage 504 of FIG. 5 can differ from that of FIG. 3A in that it can further include a first helper transistor 509A and a second helper transistor 509B connected to first internal node 512 and second internal node 514, respectively. Helper transistors (509A and 509B) can be activated by incoming signals INT and INT B directly, to start overcoming the latched state in response to a transition in input signal IN. Thus, inclusion of such devices can increase the speed at which shift stage 504 can switch between latched states (e.g., between OUT X=VDD_HI/OUT XB=VSS and OUT X=VSS/OUT XB=VDD_HI). In the very particular example of FIG. 5, first helper transistor 509A can be an n-channel FET having a drain connected to a shifted high power supply VDD_HI, a source connected to internal node 512, and a gate connected to input path 524. Second help transistor 509B can also be an n-channel FET having a drain connected to a shifted high power supply VDD_HI, a source connected to internal node 514, and a gate connected to input path 522.

Output stage 506 can have the same general configuration as output stage 406 shown in FIG. 4, thus like sections are shown with the same reference character but with the first digit being a "5" instead of a "4". Output stage 506 can differ from that of FIG. 4 in that a pull-up switch 516 can be a p-channel pull-down FET, and a pull-down switch 518 can be an n-channel FET. In addition, within a keeper circuit 550, a first keeper switch 526 and first feedback switch 528 can be n-channel FETs having source-drain paths arranged in series with one another. Similarly, a second keeper switch 524 and second feedback switch 522 can be p-channel FETs having source-drain paths arranged in series with one another. Keeper logic 540 can be an inverter.

Output stage 506 can further include an input inverter 530 having an input that receives signal OUT XB and an output that provides signal OUT Y. Input inverter 530 can ensure signal OUT Y has a correct polarity. FIG. 5 also shows a buffer inverter 542 with an input connected to output node 520 and an output that provides an output signal OUT. Buffer inverter 542 can ensure signal OUT has a desired polarity and is driven at a desired strength.

Referring still to FIG. 5, a level shifting circuit 500 can have delay components that can be determined according to the type of transition in input signal IN. However, such components result in delays for each type of transition that can be more balanced with one another as compared to conventional approaches like that of FIG. 9. In particular, a conventional low-to-high response can be described as introducing a rise delay (Delay_HI) expressed as follows:

$$\text{Delay\_HI} = tf(522A) + tr(522B) + tf(510A) + tr(508B/509B) + tf(518) + tr(542)$$

where tf(522A) is a fall delay introduced by inverter 522A, tr(522B) is a rise time introduced by inverter 522B, tf(510A) is the delay introduced by input transistor 510A driving internal node 512 low enough to turn on shifting transistor 508B, tr(508B/509B) is the delay introduced by shifting and helper transistors (508B and 509B) driving signal OUT X high enough to turn on pull-down switch 518, tf(518) is a fall delay introduced by pull-down switch 518, and tr(542) is a rise time introduced by buffer inverter 542.

In a similar fashion, a high-to-low response can be described as introducing a fall delay (Delay_LO) expressed as follows:

$$\text{Delay\_LO} = tr(524A) + tf(524B) + tr(524C) + tf(510B) + tr(508A/509A) + tf(530) + tr(516) + tf(542)$$

where tr(524A) is a rise time introduced by inverter 524A, tf(524B) is a fall delay introduced by inverter 524B, tr(524C) is a rise time introduced by inverter 524C, tf(510B) is the delay introduced by input transistor 510B driving internal node 514 low enough to turn on shifting transistor 508A, tr(508A/509A) is the delay introduced by shifting and helper transistors (508A and 509A) driving signal OUT XB higher than a threshold voltage of inverter 530, tf(530) is fall time introduced by inverter 530, tr(516) is a rise time introduced by pull-up switch 516, and tf(542) is a rise time introduced by buffer inverter 542.

Because inverters 522A, 522B, 524A, 524B and 524C all reside in the low voltage domain, the delays introduced by the two paths within input section 502 can be balanced with another. This can be expressed as follows:

$$\text{Delay\_IN} = tf(522A) + tr(522B) \approx tr(524A) + tf(524B) + tr(524C)$$

In a similar fashion, because inverter 530, pull-up switch 516, pull-down switch 518, and inverter 542 all reside in a shifted voltage domain, it can be easier to balance the different delays introduced by this path. This can be expressed as follows:

$$\text{Delay\_OUT} \approx tf(518) + tr(542) \approx tf(530) + tr(516) + tf(542)$$

Substituting these delays into the overall delay equations gives the following:

$$\text{Delay\_HI} \approx \text{Delay\_IN} + tf(510A) + tr(508B/509B) + \text{Delay\_OUT}$$

$$\text{Delay\_LO} \approx \text{Delay\_IN} + tf(510B) + tr(508A/509A) + \text{Delay\_OUT}$$

Preferably, transistors pairs 508A/508B, 509A/509B, and 510A/510B are matching pairs. That is, within a given pair, the transistors are of the same size, and formed together with the same process steps. Consequently, the rise and fall times of such devices can essentially track one another over variations in process, operating voltage, and/or temperature. In such a case, the delays introduced by shift stage 504 can be essentially equal to one another:

Delay_SHIFT≅tf(510A)+tr(508B/509B)≅tf(510B)+tr(508A/509A)

In this way, a level shifting circuit can provide essentially the same delay regardless of transition type:

Delay_HI≅Delay_IN+Delay_SHIFT+Delay_OUT

Delay_LO≅Delay_IN+Delay_SHIFT+Delay_OUT

Figure 6:
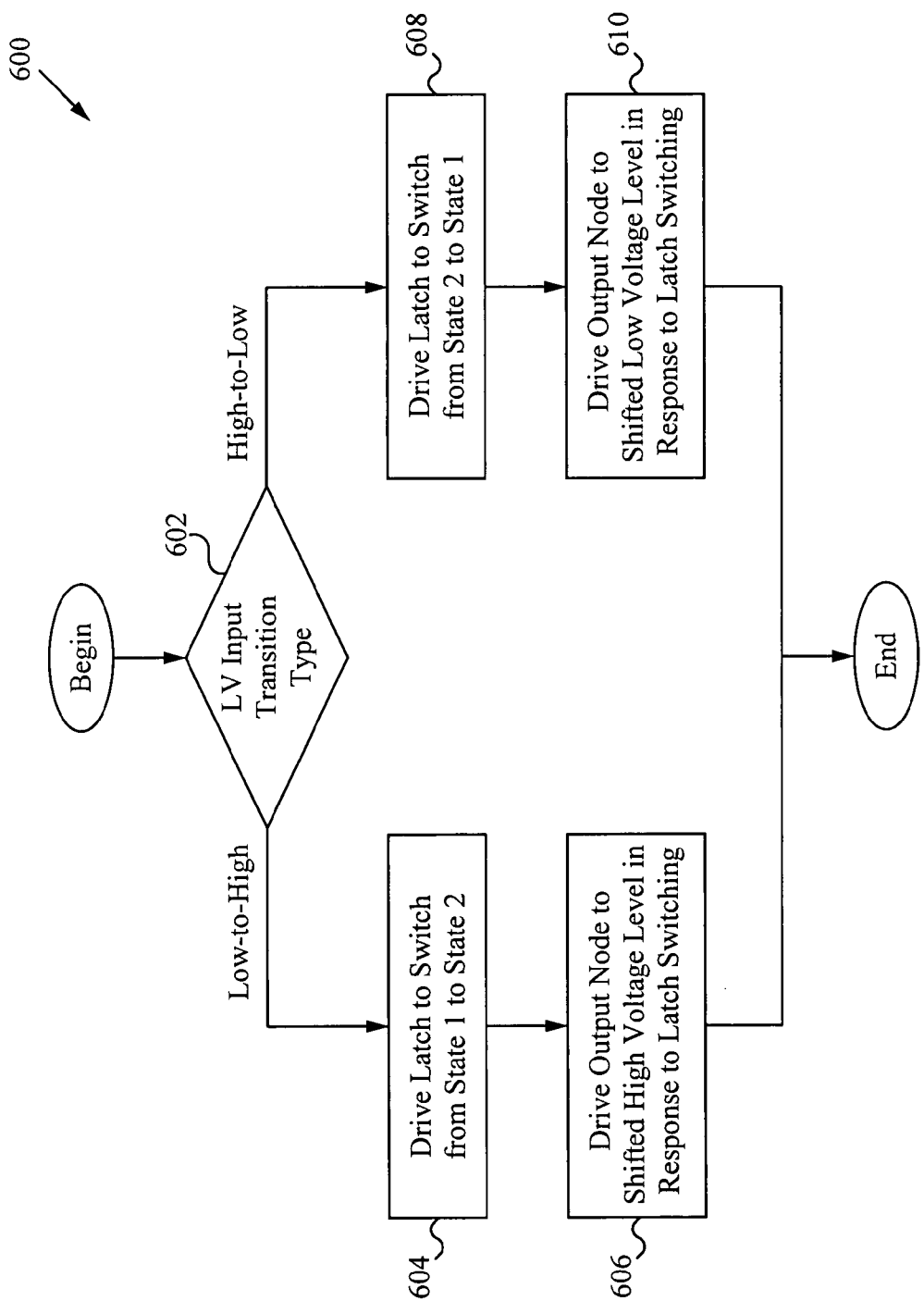
FIG. 6 shows a process flow diagram of a method of signal balancing using a level shifting circuit according to an embodiment of the invention.

While the above embodiments have shown various level shifting circuits, other embodiments can include methods of level shifting a signal. One example of a method is shown in a flowchart in FIG. 6, and designated by the general reference character 600. A method 600 can include determining a transition type (step 602). If a transition is one type (in this case low-to-high), method 600 can continue and drive a latch so that it switches from a first state to a second state (step 604). The method can then drive an output node to a shifted high voltage in response to the latch switching (step 606). Thus, between a first type transition (e.g., low-to-high) of an input signal and a shifted output being driven high, there can be a delay from a latch switching state.

If a transition is of another type (in this case high-to-low), method 600 can continue and drive a latch so that it switches from a second state to a first state (step 608). The method can then drive an output node to a shifted low voltage in response to the latch switching (step 610). Thus, between a second type transition (e.g., high-to-low) of an input signal and a shifted output level being driven low, there can be a delay from a latch switching state.

In a preferred arrangement, the time for a latch to switch from a first state to a second state can be essentially the same as that for the latch to switch from the second state to the first state.

In this way, an output signal having a balanced rise and fall can be produced at an output node of a level shifting circuit.

While the above embodiments have shown level shifting circuits and methods, other embodiments can include data clock circuits that include level shifters. One such arrangement is shown in FIG. 7.

Figure 7:
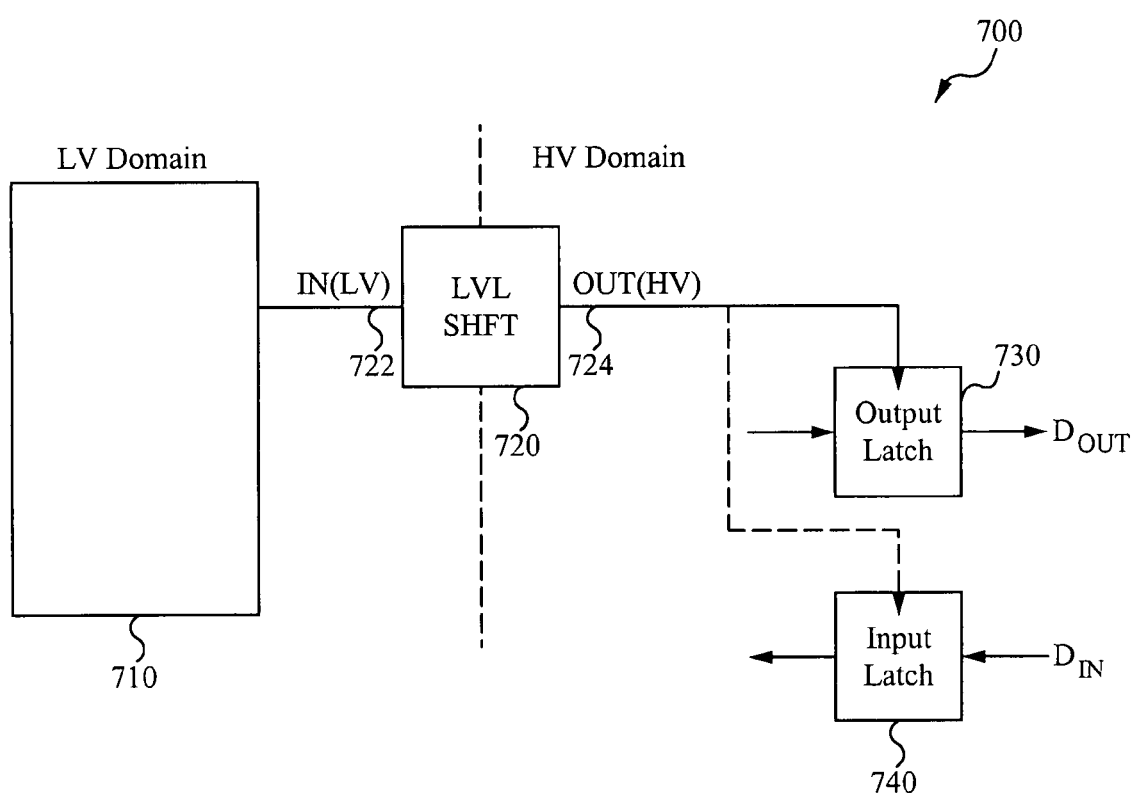
FIG. 7 is a block schematic diagram of a particular example of a CAM circuit using a level shifting device according to an embodiment of the invention.

Referring now to FIG. 7, integrated circuit (IC) device according to a very particular example is shown in a block schematic diagram and designated by the general reference character 700. An IC device 700 can include a low voltage domain circuit 710, a level shifting circuit 720, an output latch 730, and/or an input latch 740. A low voltage domain circuit 710 can receive power supply levels having a first range. As shown in FIG. 7, a low voltage domain circuit 710 can output a signal IN that can be a low voltage signal. That is, signal IN can vary within a low voltage range.

A level shifting circuit 720 can include any of the level shifting circuits above, or perform any of the level shifting circuit methods above, or equivalents thereof. Accordingly, in response to signal IN, level shifting circuit 720 can generate a high voltage signal OUT that varies within a high voltage range, greater than the low voltage range. Delays between transitions in signal IN and resulting signal OUT can be essentially the same, according to the embodiments noted above.

An output latch 730 can be situated in an output data path of IC device 700. In particular, data can be clocked out of output latch 730 in response to high voltage signal OUT. Because delays incurred while generating signal OUT can be balanced (i.e., essentially not vary according to transition type), signal OUT can provide advantageously predictable timing over variations in manufacturing process, temperature, and operating voltage.

In addition or alternatively, input latch 740 can be situated in an input data path of IC device 700. In particular, data can be clocked in from input latch 730 in response to high voltage signal OUT. Again, because signal OUT delays are balanced with respect to transition type, data can be clocked in according to advantageously predictable timing.

Figure 8:
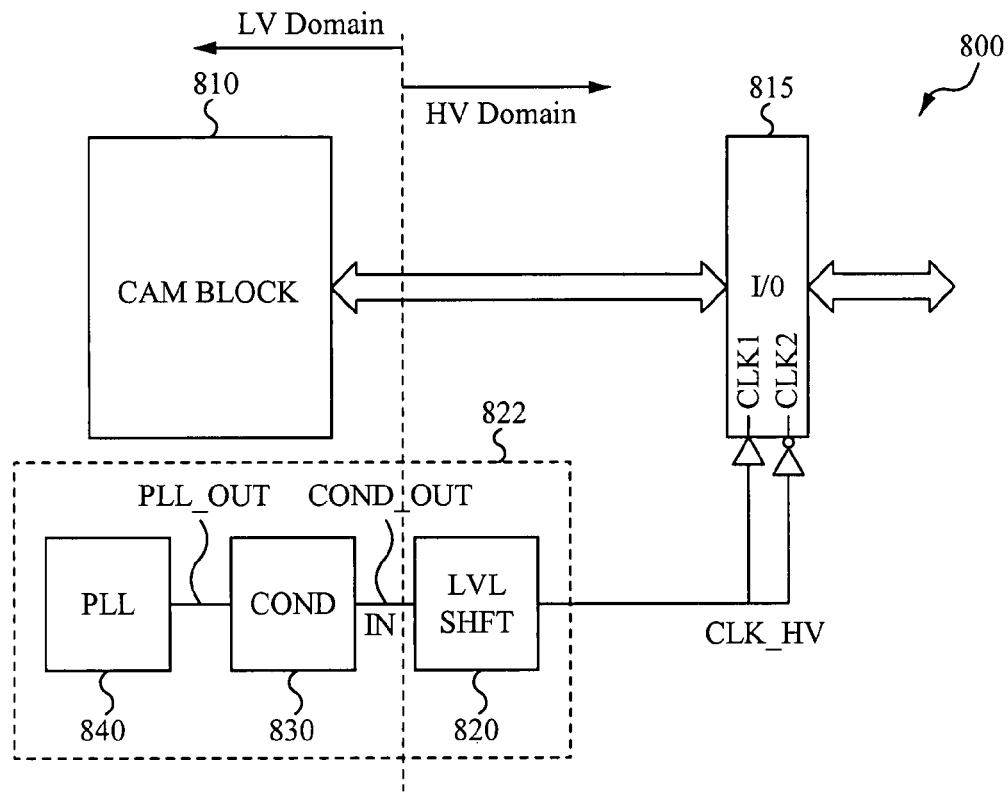
FIG. 8 is a block schematic diagram of another particular example of a CAM circuit using a level shifting device according to an embodiment of the invention.

Referring now to FIG. 8, another IC device, a content addressable memory (CAM) device, according to one embodiment is shown in a block schematic diagram and designated by the general reference character 800. A CAM device 800 can be conceptualized as being divided into at least a low voltage (i.e., non-shifted) domain (LV DOMAIN) and a high voltage (shifted) domain (HV DOMAIN). Circuits within the low voltage domain can generate signals that vary within a first range. Circuits within the high voltage domain can generate signals that vary within a second range greater than the first range. In the very particular example of FIG. 8, low and high voltage domains are delineated by a dashed line. Further, circuits within the low voltage domain can generate logic signals that can vary between a voltage VL and VH(LV). Circuits within the high voltage domain can generate logic signals that can vary between a voltage VL and VH(HV).

Referring still to FIG. 8, a CAM device 800 can include a CAM block 810, an input/output (I/O) section 815, a level shifting circuit 820, and a timing signal section 822. A CAM block 810 can include a CAM cell array can corresponding circuits that can receive a search key value (i.e., comparand, or compare data), and perform a search operation on data values stored within. A CAM device 800 preferably has a high operation speed, established by internal clock signals, in order to execute such search operations in as fast a time as possible. Elements of a CAM block well known to those skilled in the art are not shown in FIG. 8 to avoid unduly cluttering the view.

An I/O section 815 can provide data paths to and from CAM block 810 in response to both edges of signal CLK_HV. That is, data can be input and/or output at a "double data rate" with respect to signal CLK_HV. An I/O section 815 can operate according to predetermined "set up" and "hold" times referenced to both edges of signal CLK_HV (shown in FIG. 8 as CLK1 and CLK2).

A timing section 822 can include a signal generation section 840, a low voltage signal conditioning section 830, and a level shifting circuit 820. A signal generation section 840 can generate a timing signal by which operations within a CAM device 800 can be executed. In the very particular example of FIG. 8, a signal generation section 840 is a phase locked loop (PLL) circuit, more particularly, a PLL circuit that can "lock" onto a received external clock signal (or a multiplied or divided version of such an external clock). However, in alternate embodiments a signal generation section 840 can include delay locked loop (DLL) type circuit, or a clock buffer, as but two possible examples. A signal generation section 840 can output a low voltage signal PLL_OUT that does not include a balanced duty cycle.

A signal conditioning section 830 can condition a signal PLL_OUT to generate another low voltage signal COND_OUT having a balanced duty cycle.

A level shifting circuit 820 can include any of the level shifting circuits above, or perform any of the level shifting circuit methods above, or equivalents thereof. Accordingly, in response to signal COND_OUT, level shifting circuit 820 can generate a high voltage signal CLK_HV. Such a signal CLK_HV can introduce delays between corresponding transitions of signal COND_OUT that are essentially the same. Signal CLK_HV can be buffered and inverted to generate clocks CLK1 and CLK2 for double data rate I/O section 815.

Figure 8A:
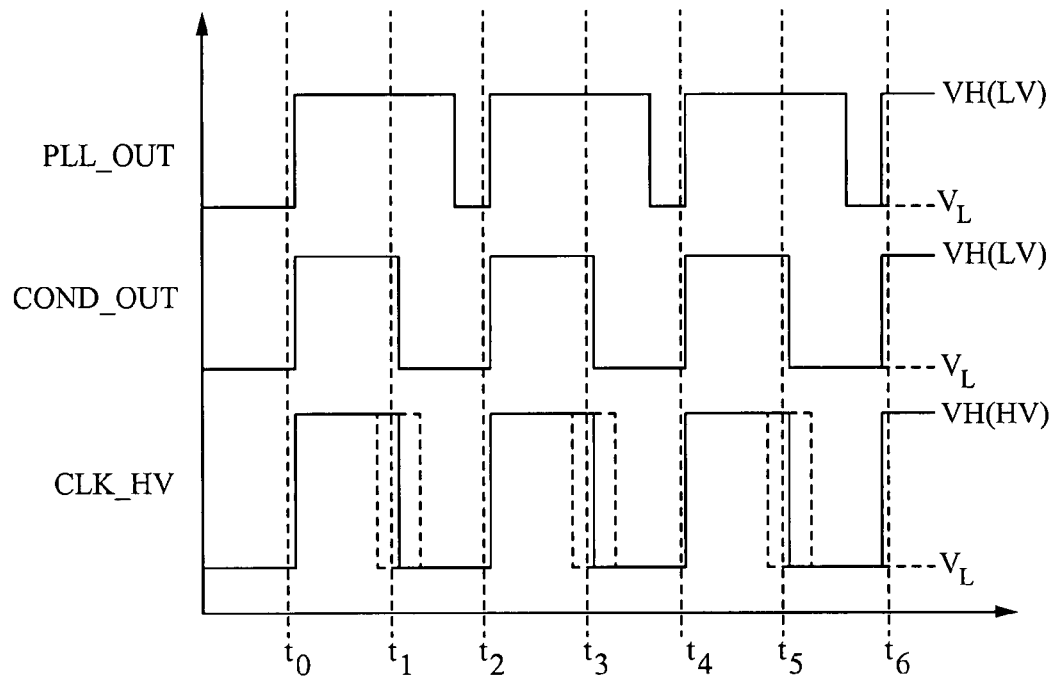
FIG. 8A is a timing diagram showing an operation of the level shifting device shown in FIG. 8.

To understand various features of the embodiment of FIG. 8, a timing diagram is shown in FIG. 8A. FIG. 8A shows the signals PLL_OUT, COND_OUT and CLK_HV shown in FIG. 8. As noted above, a signal PLL_OUT can have an uneven duty cycle. As a result, such a signal can be unsuitable for double data rate timing circuits that utilize rising and falling edges of a same signal.

Signal COND_OUT shows how a signal conditioning section 830 can generate a signal having an essentially 50% duty cycle. However, signal COND_OUT is a low voltage signal, and hence unsuitable for driving circuits within I/O section 815.

The solid waveform of signal CLK_HV shows how a level shifting circuit 820 can generate a high voltage signal that can retain an essentially 50% duty cycle by providing a same essential delay for both types of transitions. The dashed line waveform shows how a duty cycle could be distorted absent the balanced level shifting provided by level shifting circuit 820.

In this way, shifted (i.e., high voltage) timing signals within a CAM device can be generated by level shifting circuits that do not introduced unbalanced delays with respect to transition type.

While some of the above embodiments have shown arrangements that provide shifting for high levels of an input signal, alternate arrangements can provide for shifting of low levels of such signals.

It is also understood that the embodiments of the invention may be practiced in the absence of an element and or step not specifically disclosed. That is, an inventive feature of the invention can be elimination of an element.

Accordingly, while the various aspects of the particular embodiments set forth herein have been described in detail, the present invention could be subject to various changes, substitutions, and alterations without departing from the spirit and scope of the invention.

What is claimed is:

1. A level shifting circuit, comprising:
    a shift stage that latches first and second internal nodes to opposite shifted logic potentials in response to different transitions at an input signal node, the input signal node varying between non-shifted logic potentials;
    an output stage that enables a first controllable impedance path coupled between an output node and a first shifted power supply node in response to a first type transition at the first internal node, and enables a second controllable impedance path coupled between the output node and a second shifted power supply node in response to the first type transition at the second internal node; and
    a keeper circuit that maintains the output node at a predetermined shifted logic potential and includes
        a first break switch coupled to the output node that is disabled in response to a potential at one of the internal nodes, and
        a first feedback switch coupled between the first break switch and one of the shifted power supply nodes that is enabled in response to a potential at the output node.

2. The level shifting circuit of claim 1, wherein the shift stage comprises:
    a first transistor having a controllable current path coupled between the first internal node and the first shifted power supply node and a control terminal coupled to the second internal node, and
    a second transistor having a controllable current path coupled between the second internal node and the first shifted power supply node and a control terminal coupled to the first internal node.

3. The level shifting circuit of claim 1, wherein the shift stage comprises:
    a first input transistor having a controllable current path coupled between the first internal node and the second shifted power supply node and a control terminal coupled to the input signal node, and
    a second input transistor having a controllable current path coupled between the second internal node and the second shifted power supply node and a control terminal coupled to the input signal node.

4. The level shifting circuit of claim 1, further comprising:
    an input stage comprising
    a non-inverting signal path that provides a non-inverted version of an input signal to the shift stage, and
    an inverting signal path that provides an inverted version of the input signal to the shift stage.

5. The level shifting circuit of claim 1, wherein the keeper circuit includes:
    the first break switch being disabled in response to a potential at the first internal node,
    the first feedback switch being coupled between the first break switch and the second shifted power supply node,
    a second break switch coupled to the output node that is disabled in response to a potential at the second internal node, and
    a second feedback switch coupled between the second break switch and the first shifted power supply node, the second feedback switch being enabled in response to a potential at the output node.

6. A method of signal balancing for a level shifting circuit, comprising:
    in response to a first type input transition in an input signal that varies between non-shifted voltage levels, forcing a first type transition at a first internal node by causing a bistable circuit to switch from a first state to a second state after a first delay, and driving an output node to a high shifted voltage in response to the first type transition at the first internal node;
    in response to a second type input transition in the input signal, forcing the first type transition at a second internal node by causing the bistable circuit to switch from the second state to the first state after essentially the first delay, and driving the output node to a low shifted voltage in response to the first type transition at the second internal node;
    after driving the output node to the high shifted voltage, keeping the output node at the high shifted voltage with a first keeper device; and
    isolating the first keeper device from the output node in the event the second internal node makes the first type transition.

7. The method of claim 6, wherein:
    the step of causing the bistable circuit to switch from the first state to the second state includes driving the first internal node to a first shifted voltage level from a second shifted voltage level to thereby latch the second internal node at the second shifted voltage level, and the step of causing the bistable circuit to switch from the second state to the first state includes driving the second internal node to the first shifted voltage level from the second shifted voltage level to thereby latch the first internal node at the second shifted voltage level.

8. The method of claim 6, wherein:

the high and low shifted voltage levels include a first voltage and a shifted voltage and the non-shifted voltage levels include the first voltage and a non-shifted voltage; and the first type transition includes a transition from the first voltage to the shifted voltage.

9. The method of claim 6, further including:

inverting the input signal to create an inverted input signal; and latching the first and second internal nodes at opposite shifted voltage levels includes in response to the input signal transitioning to a first non-shifted voltage level, driving a first internal node to a first shifted voltage level from a second shifted voltage level to thereby latch the second internal node at the second shifted voltage level, and in response to the inverted input signal transitioning to the first non-shifted voltage level, driving the second internal node to the first shifted voltage level from the second shifted voltage level to thereby latch the first internal node at the second shifted voltage level.

10. The method of claim 6, further including:

after driving the output node to the low shifted voltage, keeping the output node at the low shifted voltage level with a second keeper device; and isolating the second keeper device from the output node in the event the first internal node makes the first type transition.

11. The method of claim 6, further including:

generating the input signal with a timing circuit formed on a first portion of an integrated circuit that receives the non-shifted voltage levels as power supply voltage levels; and enabling a data transmission path in response to the potential at the output node, the data transmission path being formed on a second portion of the integrated circuit that receives the shifted voltage levels as power supply voltage levels.

12. A level shifting circuit, comprising:

a means for shifting that latches first and second internal nodes to opposite shifted logic potentials in response to different transitions in a first input signal that varies within a low voltage range;

output means for coupling an output node to a first shifted power supply node in response to a first type transition at the first internal node after a first delay, and for coupling the output node to a second shifted power supply node in response to the first type transition at the second internal node after a second delay; wherein the low voltage range is less than a difference between the opposite shifted logic potentials and the first delay is essentially the same as the second delay; and keeper means for maintaining the output node at a second shifted logic level after the second internal node makes the first type transition with a first feedback device coupled to the output node, and isolating the first feedback device from the output node in the event the first internal node makes the first type transition.

13. The level shifting circuit of claim 12, wherein:

the keeper means further includes maintaining the output node at a first shifted logic level after the first internal node makes the first type transition with a first feedback device coupled to the output node.

14. An integrated circuit device, comprising:

a shift stage that, in response to a first type transition of an input signal, drives a first internal node to a first shifted voltage, and after a first delay, drives a second internal node to a second shifted voltage, and in response to a second type transition of the input signal, drives the second internal node to the first shifted voltage, and after a second delay, drives the first internal node to the second shifted voltage;

an output stage that enables a first controllable impedance path coupled between an output node and a first shifted voltage in response to the potential at the first internal node through a first output circuit signal path, and enables a second controllable impedance path coupled between the output node and a second shifted voltage in response to the potential at the second internal node through a second output circuit signal path; and a data path circuit that enables or prevents a data signal to propagate through a signal path in response to the potential at the output node.

15. The integrated circuit of claim 14, further including:

an input section having an input coupled to receive the input signal, a non-inverting signal path that provides a non-inverted version of the input signal to the shift stage after a first input delay, and an inverting signal path that provides an inverted version of the input signal to the shift stage after a second input delay, wherein the second input delay is essentially the same as the first input delay.

16. The integrated circuit of claim 14, wherein the output stage further includes:

a first keeper circuit that maintains the output node at the first shifted voltage via a feedback path coupled to the output node.

17. The integrated circuit of claim 14, wherein:

the difference between levels of the input signal is less than the difference between the first and second shifted voltages, the first delay is essentially the same as the second delay, and the first and second output circuit signal paths introduce essentially the same signal delay.

18. The integrated circuit of claim 14, further including:

a timing circuit that generates a periodic signal as the first input signal;

a content addressable memory (CAM) cell section; and the data path circuit is selected from the group consisting of: data input circuits that couple data from input terminals of the integrated circuit to the CAM cell section and data output circuits that couple data from the CAM cell section to output terminals of the integrated circuit.

* * * * *